(12) United States Patent
Handshoe et al.

(10) Patent No.: US 8,294,477 B2
(45) Date of Patent: Oct. 23, 2012

(54) HIGH VOLTAGE SENSING CAPACITOR AND INDICATOR DEVICE

(75) Inventors: Sam Handshoe, Catlettsburg, KY (US); Bill Blankenship, Lavalette, WV (US)

(73) Assignee: SMC Electrical Products, Inc., Barboursville, WV (US)

( * ) Notice: Subject to any disclaimer, the term of this patent is extended or adjusted under 35 U.S.C. 154(b) by 420 days.

(21) Appl. No.: 12/622,722

(22) Filed: Nov. 20, 2009

(65) Prior Publication Data

US 2011/0121820 A1    May 26, 2011

(51) Int. Cl.
G01R 27/26    (2006.01)
G01R 1/20     (2006.01)

(52) U.S. Cl. ............ 324/686; 324/126; 324/673

(58) Field of Classification Search ......... 324/126, 324/519, 658–661, 672–673, 686–688, 690
See application file for complete search history.

(56) References Cited

U.S. PATENT DOCUMENTS

| | | | |
|---|---|---|---|
| 4,002,976 A | 1/1977 | Zulaski | |
| 4,074,193 A | 2/1978 | Kohler | |
| 4,347,429 A | 8/1982 | Will | |
| 4,419,713 A | 12/1983 | Levinson | |
| 5,051,733 A | 9/1991 | Neuhouser | |
| 5,065,142 A | 11/1991 | Green | |
| 6,538,422 B2 | 3/2003 | Potter et al. | |
| 6,677,743 B1 * | 1/2004 | Coolidge et al. | 324/126 |
| 6,847,210 B1 * | 1/2005 | Eydelman et al. | 324/318 |
| 7,049,827 B2 * | 5/2006 | Horz et al. | 324/632 |
| 7,126,348 B2 * | 10/2006 | Adolfsson et al. | 324/658 |
| 7,394,642 B2 | 7/2008 | Grossniklaus et al. | |
| 7,459,901 B2 | 12/2008 | Barrault | |
| 8,093,913 B2 * | 1/2012 | Takimoto et al. | 324/671 |
| 2003/0057560 A1 | 3/2003 | Tatoh | |
| 2005/0001634 A1 * | 1/2005 | Kaiser et al. | 324/658 |
| 2005/0122122 A1 * | 6/2005 | Yakymyshyn et al. | 324/705 |

OTHER PUBLICATIONS

Handshoe, Sam, International Search Report from U.S. Patent and Trademark Office, mailed Feb. 7, 2011, 16 pages.

* cited by examiner

*Primary Examiner* — Joshua Benitez Rosario
(74) *Attorney, Agent, or Firm* — Brian S. Steinberger; Phyllis K. Wood; Law Offices of Brian S. Steinberger, P.A.

(57) ABSTRACT

A high-voltage sensing capacitor as an interface apparatus that may be used to attach an indicator unit to a high-voltage AC electrical bus and to provide safety to maintenance personnel. The high-impedance nature of the sensing capacitor effectively isolates the indicator unit from the high-voltage source to which it is connected. Multiple electrical phases can be interfaced using a plurality of such sensing capacitors. The sensing capacitor can be directly mounted to a high-voltage busbar. The indicator unit may provide visual and/or audible alerts to maintenance personnel when high voltage conditions are detected on the busbar by the sensing capacitor. The sensing capacitor is comprised of a portable, unitary capacitive structure that includes a molded insulator body encapsulating two electrodes. The electrodes of the capacitor only partially or incompletely overlap within the insulator body. The electrode spacing and configuration is structured to provide a deliberate amount of coupling between the two electrodes in the presence of an AC electric field. Because of rules governing Abstracts, this Abstract should not be used to construe the claims in this patent application.

22 Claims, 2 Drawing Sheets

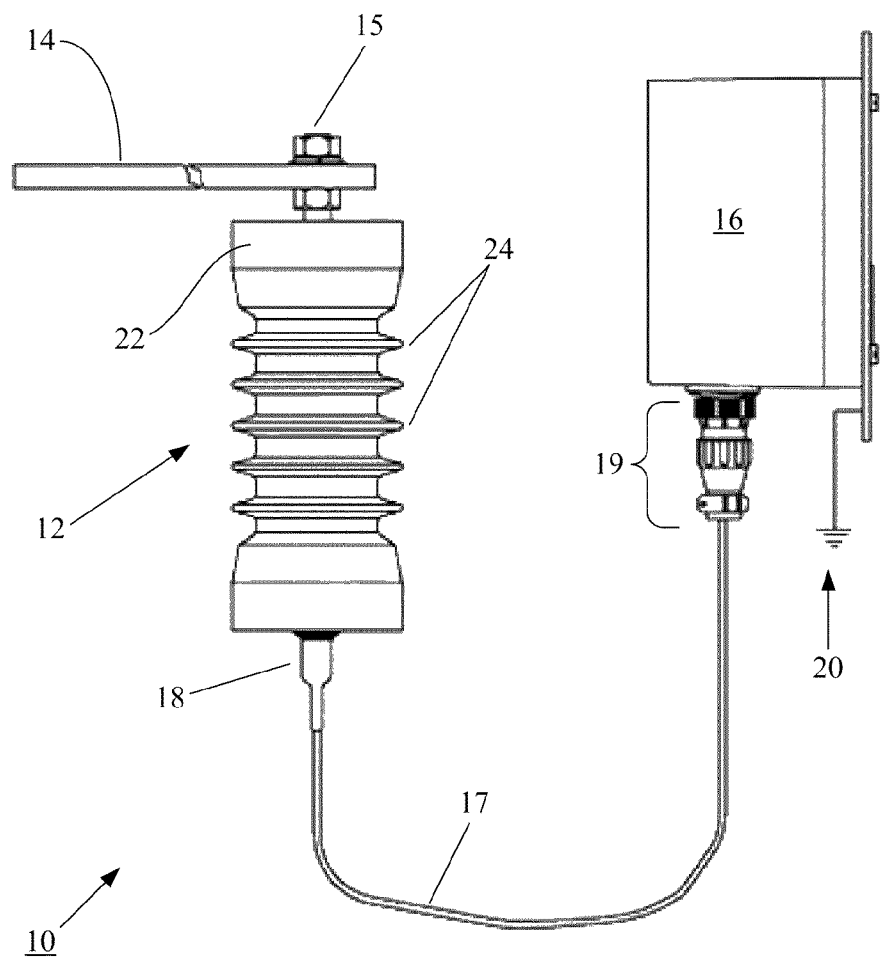
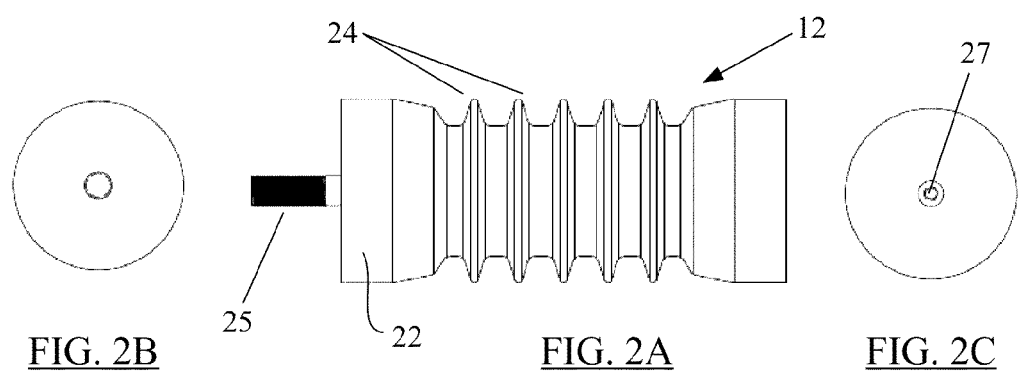
FIG. 1
FIG. 2B   FIG. 2A   FIG. 2C

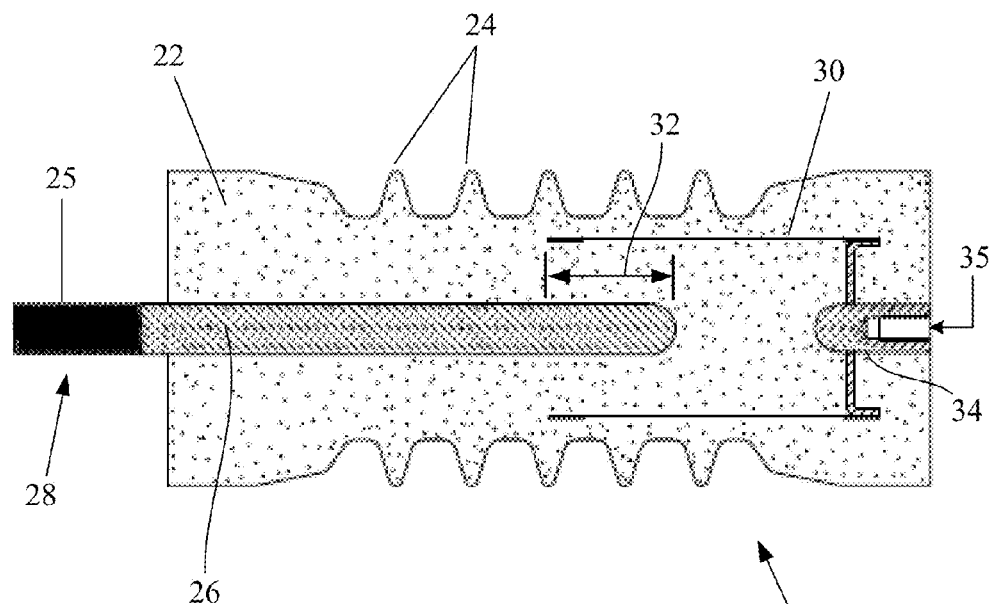
FIG. 3
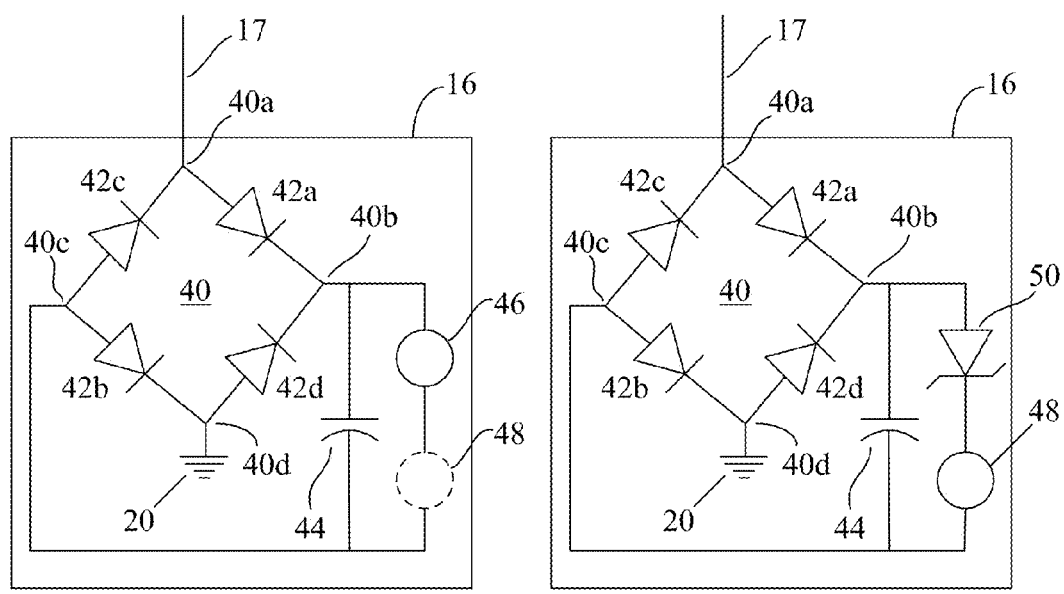
FIG. 4
FIG. 5

HIGH VOLTAGE SENSING CAPACITOR AND INDICATOR DEVICE

BACKGROUND

1. Field of the Disclosure

The present disclosure generally relates to the field of sensing or detection of presence of high voltages on electrical conductors in AC (alternating current) power distribution systems, and, more particularly, to a high voltage sensing capacitor with electrodes having an incomplete or partial overlap and are substantially completely encapsulated within an insulator body.

2. Brief Description of Related Art

High voltage single and multi-phase AC (alternating current) power sources are utilized in many industries. The use of high voltage AC power distribution systems is accompanied by the risk that electrical maintenance personnel (and others) may inadvertently come into contact with energized conductors and be electrocuted or seriously injured. Thus, it is desirable to safely determine if a particular segment of an electrical bus is energized. Such determination of existence or magnitude of these high voltage conditions may prevent human injuries or deaths.

U.S. Pat. No. 5,065,142 ("the '142 patent") discusses a safety apparatus for indicating a live AC voltage condition in an insulated electrical conductor having a central conductor wire. A capacitor is constructed around the insulated conductor so the high voltage central conductor wire within the insulation forms an inner electrode of the capacitor and the conductor insulation forms the principal dielectric of the capacitor. The outer capacitor electrode is slidably placed onto the insulated conductor. Such capacitor provides a high impedance circuit through a gas discharge lamp to ground. The current through the capacitor is sufficient to cause the discharge tube to glow when the high voltage circuit is energized, thus providing a visible warning to maintenance personnel. Each of the three phases of an electrical distribution network can be independently monitored in this manner.

The safety apparatus discussed in the '142 patent may not be suitable to be attached to a busbar in a piece of switchgear. Hence, a busbar-based voltage sensing device may be desirable for higher voltage applications.

Furthermore, it is observed here that some existing high-voltage interface apparatus are constructed such that the electrodes and the dielectric material of the capacitive interface are exposed to air. This exposure to air may create corona and fringing, which may in turn create a partial discharge condition. The partial discharge may cause a continual degradation in the capacitor's dielectric material that may eventually cause a "punch-through" dielectric failure. Such a failure may be catastrophic and irreversible. The dielectric failure may not only render the capacitive interface useless to provide the voltage sensing functionality, but may also create potentially unsafe and hazardous short-circuit conditions on high-voltage conductors. Hence, it also may be desirable to provide a high-voltage sensing device that can avoid potentially destructive partial discharges when used under ambient surroundings.

SUMMARY

A high-voltage sensing capacitor according to one embodiment of the present disclosure is an interface apparatus that may be used to attach an indicator unit to a high-voltage AC electrical bus (single-phase or three-phase). Multiple electrical phases can be interfaced using a plurality of such sensing capacitors. The sensing capacitor can be directly mounted to a high-voltage busbar. The indicator unit may provide visual and/or audible alerts to maintenance personnel when high voltage conditions are detected on the busbar by the sensing capacitor. Thus, the sensing capacitor can be used in conjunction with a suitable indicator unit to provide safety or transducer functions.

In one embodiment, the present disclosure relates to a sensing capacitor that comprises a portable, unitary capacitive structure, which includes a pair of electrical conductors having an incomplete overlap and a physical separation therebetween; and an insulator body of a dielectric material substantially completely encapsulating the pair of electrical conductors and the physical separation therebetween, wherein the insulator body is configured to allow external electrical connections to be made to the pair of electrical conductors.

In a further embodiment, the present disclosure relates to a high voltage sensing configuration that comprises a sensing capacitor and an indicator unit. The sensing capacitor includes: a first electrode having an inner portion and an outer portion, wherein the outer portion is electrically connected to a high voltage busbar of an AC power source; a second electrode having a hollow cylindrical shape that surrounds only a part of the inner portion of the first electrode so as to partially overlap the inner portion while leaving a space between the first and the second electrodes throughout a region of the overlap; an output terminal in electrical contact with the second electrode; and an insulator body of a dielectric material substantially completely encapsulating the inner portion of first electrode, the second electrode, the space between the first and the second electrodes, and the output terminal. The indicator unit is electrically connected to the output terminal (of the sensing capacitor) so as to receive capacitive current generated by the sensing capacitor when the high voltage busbar is electrically energized and to thereby provide an indication of presence of high voltage on the busbar of the AC power source.

In another embodiment, the present disclosure relates to a system comprising: a first electrode having a threaded portion and a non-threaded portion, wherein the threaded portion is configured to be electrically connected to a high voltage busbar of an AC power source; a second electrode having a hollow cylindrical shape that surrounds only a part of the non-threaded portion of the first electrode so as to incompletely overlap the non-threaded portion while leaving a space between the first and the second electrodes throughout a region of the overlap; an output terminal in electrical contact with the second electrode; and an insulator body of a dielectric material substantially completely encapsulating the non-threaded portion of first electrode, the second electrode, the space between the first and the second electrodes, and the output terminal.

Thus, the sensing capacitor according to one embodiment of the present disclosure is comprised of an insulator body encapsulating two electrodes. The electrode spacing and configuration is structured to provide a deliberate amount of coupling between the two electrodes in the presence of an AC electric field. The sensing capacitor provides a very high impedance interface to the high-voltage bus, thereby delivering only microampere-level currents to an indicator unit to enable the indicator unit to provide the desired indication of the presence of high voltages on the electrical bus. The high-impedance nature of the sensing capacitor effectively isolates the indicator unit from the high-voltage source to which it is connected.

BRIEF DESCRIPTION OF THE DRAWINGS

For the present disclosure to be easily understood and readily practiced, the present disclosure will now be described for purposes of illustration and not limitation, in connection with the following figures, wherein:

FIG. 1 illustrates a simplified view of an exemplary high voltage sensing configuration according to one embodiment of the present disclosure;

FIGS. 2A through 2C depict exemplary mechanical views of the sensing capacitor according to one embodiment of the present disclosure;

FIG. 3 shows a cross-sectional view depicting exemplary constructional details of the high-voltage sensing capacitor according to one embodiment of the present disclosure;

FIG. 4 is an exemplary circuit layout for providing audible and visual alerts through the indicator unit when high-voltage is detected by the sensing capacitor on an electrical bus of one of the AC phases; and FIG. 5 is an exemplary circuit layout similar to that in FIG. 4, but configured to provide only audible alerts through the indicator unit.

DETAILED DESCRIPTION

The accompanying figures and the description that follows set forth the present disclosure in embodiments of the present disclosure. It is to be understood that the figures and descriptions of the present disclosure included herein illustrate and describe elements that are of particular relevance to the present disclosure, while eliminating, for the sake of clarity, other elements found in typical AC power distribution systems. It is contemplated that persons generally familiar with designs, maintenance, or operation of AC power distribution systems, will be able to apply the teachings of the present disclosure in other contexts by modification of certain details. Accordingly, the figures and description are not to be taken as restrictive of the scope of the present disclosure, but are to be understood as broad and general teachings.

In the discussion herein, when any numerical value is referred, such value is understood to be the most practically-feasible design approximation taking into account variances that may be introduced by such mechanical operations as machining, tooling, drilling, threading, molding, etc. Furthermore, a range of numerical values is understood to include all values that constitute the range, unless otherwise indicated. Also, various numerical values are provided merely as examples for different embodiments of the present disclosure, without necessarily restricting availability and application of different numerical values in the context of present disclosure.

It is noted at the outset that the terms "coupled," "connected", "connecting," "electrically connected," etc., are used interchangeably herein to generally refer to the condition of being electrically connected. It is further noted that various figures (including circuit diagrams, component diagrams, or mechanical drawings) shown and discussed herein are for illustrative purpose only, and are not drawn to scale. The terms "ground," "circuit ground," or other terms of similar import (or the symbolic representation of "ground" by reference numeral "20" in various figures herein) are used interchangeably herein to refer to a common circuit ground potential (which may or may not be zero) as is known in the art.

FIG. 1 illustrates a simplified view of an exemplary high voltage sensing configuration 10 according to one embodiment of the present disclosure. As noted before, high-voltage single and multi-phase AC power sources (e.g., switchboards or switchgears, transformers, power distribution boards, substations, or other electrical apparatus) are utilized in many industries. The use of high voltage AC power distribution systems is accompanied by the risk that electrical maintenance personnel (and others) may inadvertently come into contact with energized conductors and be electrocuted or seriously injured. Thus, it is desirable to safely determine if a particular segment of an electrical bus is energized. A high-voltage sensing capacitor 12 according to one embodiment of the present disclosure may be used for this purpose as an interface apparatus between a high-voltage busbar 14 of a single-phase or three-phase AC power source and an indicator unit (also interchangeably referred to hereinbelow as "indicator device") 16 that may be used to provide visual or audible alerts of high voltage conditions on the busbar 14. In one embodiment, the sensing capacitor 12 may be directly mounted or attached to the high-voltage busbar 14 (e.g., a main busbar in a piece of switchgear) using a combination of mounting studs, hexnuts, and lockwashers collectively represented by reference numeral "15" in FIG. 1. In confined or other restrictive applications, a busbar extension (not shown) can be mounted to the main busbar to allow the sensing capacitor 12 to be conveniently mounted.

As is known in the art, the term "busbar" in electrical power distribution refers to thick, flat strips or hollow tubes of copper or aluminum that conduct electricity within a switchboard, distribution board, substation, or other single-phase or three-phase AC power source. In the discussion below, the terms "busbar," "AC bus," "bus," or "electrical bus" may be used interchangeably and such usage may be evident from the context of discussion. A busbar may provide both a mechanical and an electrical connection. Hence, busbars may be connected to each other and to other electrical apparatus by bolted or clamp connections. One such connection between the busbar 14 and the sensing capacitor 12 is illustrated in FIG. 1.

The sensing capacitor 12 provides a very high impedance interface to the high-voltage busbar 14, thereby delivering only microampere-level currents to the indicator device 16 to enable the indicator device 16 to provide the desired indication of the presence of high voltages (e.g., in the range of approximately 2.3 KVAC to approximately 27 KVAC three phase, and in the range of approximately 2.3 KVAC to approximately 18 KVAC single phase) on the electrical bus/busbar 14. The high-impedance nature of the sensing capacitor 12 effectively isolates the indicator device 16 from the high-voltage source (here, the busbar 14) to which it is connected. The output of the sensing capacitor 12 may be routed via a single conductor 17 to the indicator unit 16. A male pin or lead 18 of the conductor 17 may be inserted into an opening of a threaded output terminal 34 (not shown in FIG. 1, but illustrated in FIG. 3) of the sensing capacitor 12, whereas the female pin or lead (not visible in FIG. 1) of the conductor 17 may be connected to the indicator unit 16 via a plug and cord grip assembly 19. Under operating conditions, the current may flow from the high-voltage busbar 14 through the sensing capacitor 12 into the indicator device 16 (via conductor 17), and finally into an earth ground connection 20. In one embodiment, the ground 20 may represent the circuit or chassis ground of the indicator unit 16.

It is noted here that for ease of illustration and discussion, FIG. 1 shows the busbar 14 of only one phase of a 3-phase AC power distribution system. Although not shown here, multiple electrical phases can be interfaced using a plurality of sensing capacitors. In other words, a sensing capacitor similar to the capacitor 12 in FIG. 1 may be similarly mounted to a busbar of each remaining phase, and the outputs from all such AC phase-specific sensing capacitors may be provided to the indicator unit 16. The indicator unit 16 may be equipped to receive multiple inputs. Thus, in one embodiment, outputs from a plurality of sensing capacitors (not shown) can be connected to the indicator device 16 via a single point (e.g., via the plug and cord grip assembly 19) so as to enable the indicator device 16 to individually monitor high-voltage conditions on each electrical bus.

In the embodiment of FIG. 1, the electrodes of the sensing capacitor 12 are not visible because they are encapsulated within an insulator body 22 (of dielectric material) having a plurality of surface undulations 24. Thus, during operation of the capacitor 12, only the insulator body 22 (and its surface undulations 24) may remain exposed to ambient surroundings or air, thereby significantly reducing partial discharge conditions due to corona and fringing. In one embodiment, the insulator body 22 may be constructed using a cycloaliphatic epoxy resin as dielectric material. This resin may provide extremely high dielectric characteristics with extremely low partial discharge performance. Thus, degradation of dielectric material and, hence, a catastrophic "punch-through" dielectric failure can be significantly minimized using such resin in the sensing capacitor configuration illustrated in more detail in FIG. 3 and discussed later hereinbelow.

FIGS. 2A through 2C depict exemplary mechanical views of the sensing capacitor 12 according to one embodiment of the present disclosure. The insulator body 22 and surface undulations 24 may form the outer surface of the capacitor 12 that is exposed to air or other ambient surroundings as mentioned before. An outer portion 25 of capacitor's input electrode 28 (not visible in FIG. 2A, but shown in FIG. 3) may remain outside of the insulator body 22 so as to allow the capacitor 12 to be electrically connected, e.g., to the busbar 14. In one embodiment, the outer portion 25 is threaded so as to allow mounting of the capacitor 12 onto the busbar 14 via studs, hexnuts, and lockwashers 15 as illustrated in FIG. 1. FIG. 2B illustrates a left-hand side view and FIG. 2C illustrates a right-hand side view of the front view shown in FIG. 2A. The reference numeral "27" in the view in FIG. 2C relates to the opening 35 of the output terminal 34 encapsulated within the insulator body 22 as shown in FIG. 3 and discussed later hereinbelow. The opening 35 allows the male pin 18 of the conductor 17 to be inserted into the capacitor 12 for electrical connections.

FIG. 3 shows a cross-sectional view depicting exemplary constructional details of the high-voltage sensing capacitor 12 according to one embodiment of the present disclosure. As illustrated in FIG. 3, the sensing capacitor 12 according to one embodiment of the present disclosure is comprised of the insulator body 22 encapsulating two electrodes—a high-voltage input electrode 28, and an output electrode 30. The electrode spacing and configuration may be structured to provide a deliberate amount of coupling between the two electrodes 28, 30 in the presence of an AC electric field. In the embodiment of FIG. 3, the electrodes 28, 30 are physically separate from each other, but they have a partial (incomplete) overlap between them within the insulator body 22. As mentioned before, the sensing capacitor 12 further comprises creepage surface undulations 24 forming an external part of the insulator body 22. An output terminal 34 with an opening 35 may also form part of the capacitor structure and may allow an external electrical connection to be made to the output electrode 30 as discussed below.

As illustrated in the embodiment of FIG. 3, the insulator body 22 may be substantially cylindrical and, in one embodiment, may be constructed of cycloaliphatic epoxy resin as dielectric material for the sensing capacitor 12. In the embodiment of FIG. 3, there are five surface undulations each having a substantially annular (sloping ring- or disc-type) shape as can be more clearly seen from FIGS. 1 and 2A. However, depending on the range of operating voltages that may be applied to the sensing capacitor 12 in the field, one or more of the length, the diameter, and the number and shape of the surface undulations 24 may be varied during construction of the capacitor 12 so as to accommodate the desired range of operating voltages. The surface undulations 24 provide the surface creepage distance between the input electrode 28 and the output terminal 34. In one embodiment, the creepage distance is 12.8 inches for 18 KVAC per IEC (International Electrotechnical Commission) standards for light dust. Whereas, in another embodiment, the creepage distance is 20 inches for 25 KVAC per IEC standards for medium dust.

The input electrode 28 may consist of the outer portion 25 and an inner portion 26. The inner portion 26 may extend a prescribed distance into the insulator body 22. In one embodiment, the outer portion 25 may be ½-13 threaded to allow mounting of the sensing capacitor 12 onto the busbar 14 as mentioned before. The inner portion 26 may be non-threaded and may remain substantially encapsulated within the insulator body 22 as shown in the exemplary illustration in FIG. 3. It is noted here that the inner and outer portions 26, 25 are identified in FIG. 3 for ease of discussion only, and such identification is not meant to indicate or imply that the input electrode 28 is composed of two individual, separate, or disjoint "components" 25, 26. In other words, the reference numerals "25" and "26" are used merely to identify two different sections of the same, single structure—i.e., the input electrode 28. That is, in terms of a physical structure, each of the three reference numerals "25," "26," and "28" relates to only one physical structure—the input electrode. In one embodiment, the input electrode 28 is a partially-threaded, solid, metallic cylindrical rod having a pre-determined length. The partial-threading thus divides the electrode 28 into the inner non-threaded portion 26 and the outer threaded portion 25. Different geometries for the input electrode 28 may be used at lower voltages. Also, the length of the input electrode 28 may change if the overall design of the sensing capacitor 12 is lengthened. The input electrode 28 may be made of copper, brass, bronze, or other suitable metal or metal alloy.

In one embodiment, the output electrode 30 may be of a hollow, cylindrical shape that extends a prescribed distance into the insulator body 22 and surrounds only a portion of the input electrode 28 (i.e., a part of the inner portion 26) so as to provide an incomplete or partial overlap with the input electrode 28 as shown by way of example in FIG. 3. The placement of the electrodes 28, 30 within the insulator body 22 is such as to leave a physical separation therebetween. As illustrated in FIG. 3, the region of overlap between the electrodes 28, 30 may be indicated by the reference numeral "32." The shape of the overlap region 32 may depend on the geometry of the electrodes 28, 30. In the embodiment of FIG. 3, the overlap region 32 may be hollow cylindrical or annular in shape. In one embodiment, the output electrode 30 is a copper mesh cylinder. However, in an alternative embodiment, the output electrode 30 may be a hollow, solid cylinder of copper, brass, bronze, or other suitable metal or metal alloy. Additional geometries (e.g., a hollow rectangular or square tube) for the output electrode 30 also may be contemplated.

Although the length and diameter of the output electrode 30 may be predetermined for a given capacitor configuration, in alternative configurations these length and diameter can be varied depending on the length and diameter of the substantially cylindrical insulator body 22 and/or the degree of electrical coupling desired between the electrodes 28, 30 in view of the incomplete overlap 32 therebetween. The capacitive coupling between the input and output electrodes 28, 30 may be dependent on the extent of overlap 32 between the electrodes 28, 30.

It is observed here that the incomplete overlap 32 between the electrodes 28, 30 may be used to provide desired voltage isolation between two capacitor surfaces or electrodes. For example, in one embodiment, the input electrode 28 may be bolted directly onto a high voltage bus assembly having a voltage of approximately 18 KVAC (single phase) or 27 KVAC (three phase), whereas the output electrode or capacitor surface may be connected directly to a low voltage display alarm unit 16 operating at a voltage in the range of approximately 5-100 volts AC. Therefore, the high voltage isolation may be necessary to insure proper safe isolation of the high and low voltages during operation of the sensing capacitor 12 in conjunction with the indicator unit 16.

Referring again to FIG. 3, in one embodiment, the output electrode 30 may be electrically connected to the output terminal 34 having an opening 35 to allow an external electrical connection to be made to the output electrode 30 (e.g., via insertion of the male pin 18 of the conductor 17 as mentioned hereinbefore). In one embodiment, the output terminal 34 may be a solid copper insert, threaded terminal having a ¼-20 threaded opening 35 to connect a single conductor to the indicator device 16. In the embodiment of FIG. 3, the output terminal 34 is a solid copper insert having a diametrical shape. However, in other embodiments, the geometry of the output terminal 34 may vary depending, for example, on the conductor 17 to be used for electrical connection or on the shape and/or size of the output electrode 30. The output terminal 34 may be made of copper, brass, bronze, or other suitable metal or metal alloy that allows it to be electrically connected to the output electrode 30 through soldering, brazing, or welding.

It is observed that the insulator body 22 may substantially completely encapsulate the electrodes 28, 30 (including the space in the region of overlap 32 between the electrodes) and the output terminal 34, except at either ends of the insulator body 22 where electrode connection points are provided as illustrated in the exemplary embodiment of FIG. 3. In one embodiment, the insulator body 22, the electrodes 28, 30, and the output terminal 34 are all molded together to create a portable, unitary capacitive structure (i.e., the sensing capacitor 12). A homogenous capacitor assembly may be created by performing the molding in a single-stage vacuum de-aeration process using a fixed mold. Hence, a number of different configurations of the sensing capacitor 12 may be molded using a given mold to provide for capacitors to sense different ranges of AC voltages. In the de-aeration process, the cycloaliphatic epoxy resin may be mixed with hardener and filler compounds and degassed under high vacuum. The mix may be then injected into the mold (containing the electrodes 28,30, and the output terminal 34) and the capacitor assembly thus may be formed under heat and pressure. Potentially destructive, partial-discharge creating air voids may be removed from the epoxy resin during curing of the molded capacitor 12. The sensing capacitor 12 molded in this manner may provide optimum high-voltage performance. In one embodiment, a particle discharge (PD) test may be applied to the molded capacitor 12 by applying a very high voltage (approximately 18 kV) for one (1) minute between the threaded portion 25 and the output terminal 34 (via the opening 35). The capacitor 12 may "pass" the test if the PD level remains lower than 10 pC during the entire minute of testing.

As mentioned before, electrical coupling between the electrodes 28, 30 in the molded capacitor 12 is accomplished through the capacitive action derived from the electrodes 28, 30 and the dielectric material 22. The electrodes 28, 30 comprise the "plates" of the capacitor 12, whereas the cycloaliphatic epoxy resin (of the insulator body 22) provides the dielectric of the capacitor 12. In one embodiment, the dielectric (e.g., the cycloaliphatic epoxy resin) of the insulator body 22 may have a nominal dielectric constant of between 3 and 4. In the presence of an AC electric field, the effective capacitance of the sensing capacitor 12 creates a high impedance element that allows microampere level current to flow into the indicator device 16. Hence, effective isolation is provided between the high voltage busbar 14 and the circuitry in the indicator device 16. By varying the geometry of the electrodes 28, 30 (and, hence, the geometry of the insulator body 22), the amount of effective capacitance of the capacitor 12 can be adjusted as per the voltage-sensing requirement.

In one embodiment, the sensing capacitor 12 may provide for impedance in excess of 100 mega-ohms (MΩ) for a nominal range of input voltages (e.g., in the range of approximately 2.3 KVAC to approximately 27 KVAC three phase, and in the range of approximately 2.3 KVAC to approximately 18 KVAC single phase) on the busbar 14. For example, with reference to FIG. 3, in one embodiment, the length of the input electrode 28 may remain fixed at 6.5 inches (with 0.5 inch diameter for the electrode rod 28 and 1.25 inches long threaded outer portion 25) and the diameter of the cylindrical output electrode 30 may remain fixed at 1.73±0.03 inches, whereas the lengths of the output electrode 30 and the overlap 32 may be varied to obtain a range of capacitance and impedance values. For example, average impedance of 153±2 MΩ and average capacitance of 17±0.3 pF may be obtained when the output electrode 30 is 4.5 inches long with 2.5 inches (lengthwise) of overlap 32 between the input and output electrodes. In another embodiment, average impedance of 145±2 MΩ and average capacitance of 18±0.3 pF may be obtained when the output electrode 30 is 4.25 inches long with 2.25 inches (lengthwise) of overlap 32 between the input and output electrodes. In a still further embodiment, average impedance of 131±3.5 MΩ and average capacitance of 19.3±0.3 pF may be obtained when the output electrode 30 is 4 inches long with 2 inches (lengthwise) of overlap 32 between the input and output electrodes. Additional impedance and capacitance value may be obtained by appropriately varying the lengths of the output electrode 30 and the overlap 32 between the electrodes. It is noted here that, like the dimensions of the input electrode rod 28, the dimensions of other parts in the sensing capacitor 12 also may remain fixed while accommodating different geometries of the output electrode 30. For example, again with reference to FIG. 3, in one embodiment, the cylindrical insulator body 22 may be 7.5 inches long with 3.1 inch outermost diameter (which diameter may decrease to 2.2 inches when measured at the trough of the surface undulations 24), the output terminal 34 may be 1.125 inches long with 0.5 inch outer diameter, and the opening 35 may be 0.65 inch deep lengthwise inside the output terminal 34 (with 0.5 inch thread depth) and may have 0.201 inch diameter. All of these component geometries may be accommodated within an overall (end-to-end) length of 9 inches for the sensing capacitor 12.

It is observed here that the sensing capacitor 12 is preferably mounted directly onto a high voltage busbar or bus bracket in a vertical position as illustrated, for example, in FIG. 1. The ½-13 threaded portion 25 of the input electrode 28 may be used along with ½-13 mounting hardware 15 to directly mount the capacitor 12 onto the busbar 14. However, when the capacitor 12 is mounted in a horizontal or other non-vertical position, the non-conductive insulating material of the insulator body 22 may be used as support so as not to reduce the electrical creepage distance from the high voltage input electrode 28 to ground or to the end of the low-voltage output terminal 34. Due to the high voltages involved during operation of the sensing capacitor 12, it is desirable to have a capacitor design in which adequate creepage distance is maintained along with usage of proper dielectric material (with no air voids) for safe operation of the sensing capacitor 12.

FIG. 4 is an exemplary circuit layout for providing audible and visual alerts through the indicator unit 16 when high-voltage is detected by the sensing capacitor 12 on an electrical bus of one of the AC phases. And, FIG. 5 is an exemplary circuit layout similar to that in FIG. 4, but configured to provide only audible alerts through the indicator unit 16. Referring now to FIG. 4, a full-wave rectifier circuit 40 (comprising of diodes 42*a* through 42*d*) in the indicator unit 16 may be connected directly between the incoming conductor 17 (associated with the sensing capacitor 12 for an AC phase) and ground 20 as shown. The rectifier terminals 40*a* and 40*b* may be directly connected respectively to the corresponding conductor 17 and to ground 20. In the circuit of FIG. 4, the alternating current picked up by the electrode 30 of the high-voltage sensing capacitor 12 across insulation 22 is fully rectified by the diode bridge rectifier 40, the rectified charge being stored in a corresponding capacitor 44 that is connected across rectifier output terminals 40*c* and 40*d*.

A neon discharge bulb 46 also may be connected across the rectifier output terminals 40*c*-40*d*, in parallel with the corresponding capacitor 44. The neon discharge bulb 46 will not conduct until the voltage across the bulb reaches approximately 80 volts, when an avalanche discharge occurs and the capacitor 44 discharges instantly, creating a bright flash of light. The flashing continues at a frequency determined by the voltage on the busbar 14, the geometry of various components (e.g., the electrodes 28, 30) of the sensing capacitor 12 (and, hence, the amount of voltage isolation provided thereby), and other parameters as long as the high voltage busbar 14 is energized. The rate of flashing also may be determined, among other factors, by the phase to ground voltage of the AC power supply (e.g., the busbar 14 in FIG. 1), by the capacitance of the storage capacitor 44, and by the geometry of the sensing capacitor 12. At very high voltages, the flashing frequency may increase to a point where the effect on an operator's eye may be one long continuous flash. It may be however desirable to have the flashing frequency at a rate low enough for the operator's eye to sense that the neon bulb 46 flashes on and off.

In addition to the AC phase-specific visual alert provided by the flashing neon bulb 46, a sound-generating piezo electric device 48 may be connected in series with the neon bulb 46 as illustrated by way of the dotted circle in FIG. 4. The sound generator 48 may produce a sharp "chirp" each time the bulb 46 flashes. This option may thus provide both visible and audible alert signals. In another embodiment, where only an audible signal would be required, the circuit configuration illustrated in FIG. 5 may be used instead of that in FIG. 4 for a single AC phase. An avalanche diode 50, or any other suitable device for conducting electrical current in an avalanche mode in response to a predetermined voltage, may be substituted for the neon bulb 46 (in FIG. 4), in series with the piezo electric sound generator 48 as illustrated in FIG. 5.

It is reiterated here that the circuit configurations in FIGS. 4 and 5 are for only one of the AC phases. Three such circuit configurations—one per AC phase—may be used per installation of the indicator device 16 to monitor voltage conditions in all three electrical phases. Such additional configurations may provide protective redundancy for maximum safety. In case a circuit associated with one of the neon bulbs or avalanche diodes is defective, there are two other circuits for back-up. Furthermore, apart from the safety advantages, the visual and/or audible alerts can also save time by indicating the loss of high voltage to the equipment being monitored.

The foregoing describes a high-voltage sensing capacitor as an interface apparatus that may be used to attach an indicator unit to a high-voltage AC electrical bus and to provide safety to maintenance personnel. The high-impedance nature of the sensing capacitor effectively isolates the indicator unit from the high-voltage source to which it is connected. Multiple electrical phases can be interfaced using a plurality of such sensing capacitors. The sensing capacitor can be directly mounted to a high-voltage busbar. The indicator unit may provide visual and/or audible alerts to maintenance personnel when high voltage conditions are detected on the busbar by the sensing capacitor. The sensing capacitor is comprised of a portable, unitary capacitive structure that includes a molded insulator body encapsulating two electrodes. The electrodes of the capacitor only partially or incompletely overlap within the insulator body. The electrode spacing and configuration is structured to provide a deliberate amount of coupling between the two electrodes in the presence of an AC electric field. The sensing capacitor provides a very high impedance interface to the high-voltage bus, thereby delivering only microampere-level currents to an indicator unit to enable the indicator unit to provide the desired indication of the presence of high voltages on the electrical bus.

A high voltage sensing configuration including the sensing capacitor and indicator unit according to one embodiment of the present disclosure may be used, for example, to sense high voltage conditions in single phase and three phase AC systems applications because the configuration can respond to phase to ground voltages on each of the three (3) AC phases. The sensing capacitor and indicator unit combination is "self-contained" because it does not require separate power supply or batteries and does not need any transformers, switches or fuses. Furthermore, the combination of the sensing capacitor and indicator unit can be readily incorporated into new electrical equipment and also can be easily retrofitted to existing equipment. The sensing capacitor and indicator unit can be applied in circuit locations where alternative indicators would be impractical or too costly. Also, the sensing capacitor and indicator unit combination according to one embodiment of the present disclosure requires low maintenance because it does not require any adjustment or calibration, as can be evident from the discussion hereinabove.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A sensing capacitor consisting essentially of:
    a portable, unitary capacitive structure that includes;
    an insulator body of a dielectric material;
    first elongated electrode extending a distance into the insulator body with an input terminal end protruding from one end of the insulator body; and
    a second hollow electrode closed at one end extending a distance into an opposite end of the insulator body, the closed end forming an output terminal protruding from the end of the insulator body opposite the input terminal, the internal portion of the second electrode surrounding and partially enclosing a section of the first electrode opposite the input terminal for an incomplete overlap and a physical separation between the first and the second electrodes, and wherein said insulator body is configured to allow external electrical connections to be made to the input terminal end and the output terminal.

2. The sensing capacitor of claim 1, wherein said dielectric material is cycloaliphatic epoxy resin.

3. The sensing capacitor of claim 1, wherein said first electrode is configured to be attached to a high voltage busbar of an AC (alternating current) power source.

4. The sensing capacitor of claim 1, wherein said insulator body is substantially cylindrical.

5. The sensing capacitor of claim 4, wherein said insulator body comprises a plurality of surface undulations on an outermost surface thereof.

6. The sensing capacitor of claim 5, wherein at least one of the following is dependent on a range of operating voltages for said sensing capacitor;

a length of said substantially cylindrical insulator body; and a diameter of said substantially cylindrical insulator body; and number and shape of said surface undulations.

7. The sensing capacitor of claim 4, wherein a length and a diameter of said hollow, cylindrical shape of said second electrode is dependent on at least one of the following:

a length and a diameter of said insulator body; and a degree of electrical coupling desired between said first and said second electrodes.

8. The sensing capacitor of claim 1, further comprising a threaded output terminal residing substantially within said insulator body and in electrical contact with said second electrode so as to allow an external electrical connection to be made to said second electrode through said threaded output terminal.

9. The sensing capacitor of claim 8, wherein said second electrode is electrically connected to said threaded output terminal using a process selected from the group consisting of soldering, brazing. and welding.

10. The sensing capacitor of claim 8, wherein said first electrode, said second electrode, said insulator body, and said threaded output terminal are molded together.

11. The sensing capacitor of claim 1, wherein said first electrode is a metallic cylindrical rod that includes a threaded portion and anon-threaded portion, wherein said non-threaded portion is substantially encapsulated within said insulator body and said threaded portion remains outside of said insulator body so as to allow an external electrical connection to be made to said first electrode through said threaded portion.

12. The sensing capacitor of claim 1, wherein a length and a diameter of second electrode are predetermined, and wherein said hollow cylindrical shape has one of the following configurations;

a metallic solid configuration: and a metallic mesh configuration.

13. The sensing capacitor of claim 1, wherein a capacitive coupling between said first and said second electrodes is dependent on an extent of said overlap between said first and said second electrodes.

14. A high voltage sensing capacitor configuration consisting essentially of:

a sensing capacitor that includes:

a first elongated solid electrode having an inner portion and an outer portion, wherein said outer portion is electrically connected directly to a high voltage busbar of an AC (alternating current) power source, a second electrode having a substantially hollow cylindrical shape closed at one end that surrounds only a part of said inner portion of said first electrode so as to partially overlap said inner portion while leaving a space between said first and said second electrodes throughout a region of said overlap, an output terminal in electrical contact with said second electrode, and an insulator body of a dielectric material substantially completely encapsulating said inner portion of first electrode, said second electrode, said space between said first and said second electrodes, and said output terminal; and an indicator unit electrically connected to said output terminal so as to receive capacitive current generated by said sensing capacitor when said high voltage busbar is electrically energized and to thereby provide an indication of presence of high voltage on said busbar of said AC power source.

15. The sensing configuration of claim 14, wherein said insulator body of said sensing capacitor is substantially cylindrical with a plurality of surface undulations on an outermost surface thereof.

16. The sensing configuration of claim 14, wherein said dielectric material of said sensing capacitor is cycloaliphatic epoxy resin.

17. The sensing configuration of claim 14, wherein said indication of presence of high voltage provided by said indicator unit is at least one of the following:

a visual alert; and an audible alert.

18. The sensing configuration of claim 14, wherein a voltage on said high voltage busbar is in the range of one of the following:

approximately 2.3 KVAC to approximately 27 KVAC three phase; and approximately 2.3 KVAC to approximately 18 KVAC single phase.

19. A high voltage sensing system consisting essentially of:

a first electrode having a threaded portion and a non-threaded portion, wherein said threaded portion is configured to he electrically connected directly to a high voltage busbar of an AC (alternating current) power source;

a second electrode having a substantially hollow cylindrical shape that surrounds only a part of said non-threaded portion of said first electrode so as to incompletely overlap said non-threaded portion while leaving a space between said first and said second electrodes throughout a region of said overlap;

an output terminal in electrical contact with said second electrode; and an insulator body of a dielectric material substantially completely encapsulating said non-threaded portion of first electrode, said second electrode, said space between said first and said second electrodes, and said output terminal; and an indicator unit configured to be electrically connected to said output terminal so as to receive capacitive current generated when said first electrode is electrically connected to said high voltage busbar and when said high voltage busbar is electrically energized, wherein said indicator unit is configured to thereby provide an indication of presence of high voltage on said busbar.

20. The system of claim 19, wherein said indicator unit is configured to provide said indication of presence of high voltage via at least one of the following:
   a visual alert; and
   an audible alert.

21. The system of claim 19, wherein said first electrode is configured to be electrically connected to said high voltage busbar when a voltage on said high voltage busbar is in the range of one of the following:

approximately 2.3 KVAC to approximately 27 KVAC three phase; and
   approximately 2.3 KVAC to approximately 18 KVAC single phase.

22. The system of claim 19, wherein said first electrode, said second electrode, said output terminal, and said insulator body are molded together, thereby creating a unitary capacitive structure.

* * * * *